(12) United States Patent
Wu et al.

(10) Patent No.: US 8,748,873 B2
(45) Date of Patent: Jun. 10, 2014

(54) ELECTRONIC DEVICE WITH DUAL SEMICONDUCTING LAYER

(75) Inventors: Yiliang Wu, Oakville (CA); Ping Liu, Mississauga (CA); Nan-Xing Hu, Oakville (CA)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 425 days.

(21) Appl. No.: 13/011,130

(22) Filed: Jan. 21, 2011

(65) Prior Publication Data

US 2012/0187379 A1    Jul. 26, 2012

(51) Int. Cl.
*H01L 51/10* (2006.01)
*H01L 51/40* (2006.01)
*B82Y 30/00* (2011.01)
*B82Y 40/00* (2011.01)

(52) U.S. Cl.
USPC   257/40; 438/99; 257/E51.001; 257/E51.005; 977/750; 977/892

(58) Field of Classification Search
None
See application file for complete search history.

(56) References Cited

U.S. PATENT DOCUMENTS 6,803,262 B2 * 10/2004 Wu et al. ............ 438/149
2009/0140237 A1   6/2009 Wu et al.

* cited by examiner

*Primary Examiner* — Andrew K Bohaty
(74) *Attorney, Agent, or Firm* — Harness, Dickey & Pierce, P.L.C.

(57) ABSTRACT

A thin film transistor has a dual semiconducting layer comprising two semiconducting sublayers. The first sublayer comprises a polythiophene and carbon nanotubes. The second sublayer comprises the polythiophene and has no carbon nanotubes. Devices comprises the dual semiconducting layer exhibit high mobility.

17 Claims, 2 Drawing Sheets

ELECTRONIC DEVICE WITH DUAL SEMICONDUCTING LAYER

BACKGROUND

The present disclosure relates to thin-film transistors (TFTs) and/or other electronic devices comprising a semiconducting bilayer. The semiconducting bilayer comprises a first sublayer and a second sublayer. Devices comprising the semiconducting bilayer of a device exhibit high mobility and excellent.

TFTs are generally composed of, on a substrate, an electrically conductive gate electrode, source and drain electrodes, an electrically insulating gate dielectric layer which separate the gate electrode from the source and drain electrodes, and a semiconducting layer which is in contact with the gate dielectric layer and bridges the source and drain electrodes. Their performance can be determined by the field effect mobility and the current on/off ratio of the overall transistor. High mobility and high on/off ratio are desired.

Organic thin-film transistors (OTFTs) can be used in applications such as radio frequency identification (RFID) tags and backplane switching circuits for displays, such as signage, readers, and liquid crystal displays, where high switching speeds and/or high density are not essential. They also have attractive mechanical properties such as being physically compact, lightweight, and flexible.

Organic thin-film transistors can be fabricated using low-cost solution-based patterning and deposition techniques, such as spin coating, solution casting, dip coating, stencil/screen printing, flexography, gravure, offset printing, ink jet-printing, micro-contact printing, and the like. To enable the use of these solution-based processes in fabricating thin-film transistor circuits, solution processable materials are therefore required. However, organic or polymeric semiconductors formed by solution processing tend to suffer from limited solubility, air sensitivity, and especially low field-effect mobility. This poor performance may be attributable to the poor film-forming nature of small molecules.

It would be desirable to develop semiconducting compounds that exhibit high field effect mobility and good film-forming properties.

BRIEF DESCRIPTION

The present application discloses, in various embodiments, electronic devices comprising a semiconducting bilayer. These devices exhibit high mobility and good on/off ratio performance.

Disclosed in embodiments is an electronic device that includes a semiconducting bilayer. The semiconducting bilayer includes a first sublayer and a second sublayer. The first sublayer comprises a first semiconductor and carbon nanotubes, wherein the first semiconductor is a polythiophene. The second sublayer comprises a second semiconductor. In some embodiments, the second semiconductor is also a polythiophene.

In particular embodiments, the first semiconductor and the second semiconductor are each polythiophenes independently having the structure of Formula (II):

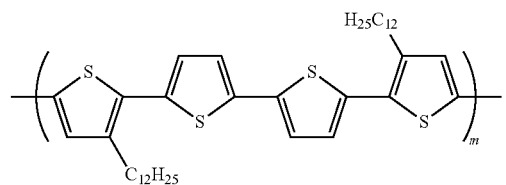

Formula (II)

wherein m is from 2 to about 2,500.

In some embodiments, the first semiconductor polythiophene has the structure of Formula (I):

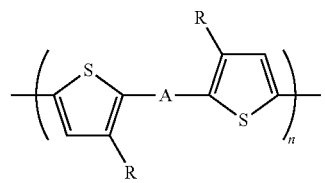

Formula (I)

wherein A is a divalent linkage; each R is independently selected from hydrogen, alkyl, substituted alkyl, alkenyl, substituted alkenyl, alkynyl, substituted alkynyl, aryl, substituted aryl, alkoxy, substituted alkoxy, a heteroatom-containing group, halogen, —CN, or —$NO_2$; and n is from 2 to about 5,000.

In some embodiments, R is alkyl having from about 6 to about 25 carbon atoms, including from about 8 to about 16 carbon atoms.

The first sublayer may comprise polymer aggregates of the first semiconductor located between or separating the carbon nanotubes.

Alternatively, the first sublayer may comprise nano aggregates formed by the first semiconducting polymer wrapping around a carbon nanotube.

In some embodiments, the first sublayer has a thickness of less than 10 nanometers.

The carbon nanotubes may be surface-modified carbon nanotubes. In embodiments, the carbon nanotubes are single-wall carbon nanotubes.

The carbon nanotubes may comprise from about 10 to about 50 wt % of the first sublayer, based on the total weight of the first semiconductor polythiophene and the carbon nanotubes. In some embodiments, the carbon nanotubes comprise from about 15 to about 40 wt % of the first sublayer, based on the total weight of the first semiconductor polythiophene and the carbon nanotubes.

The electronic device may be a thin-film transistor. In some embodiments, the device further comprises a dielectric layer in contact with the first sublayer.

Also disclosed in a process for producing an electronic device. The process comprises liquid depositing a first semiconducting composition onto a dielectric layer to form a first semiconducting layer; and liquid depositing a second semiconducting composition onto the first semiconducting sublayer to form a second semiconducting sublayer. The first semiconducting sublayer comprises a first polythiophene and carbon nanotubes. The first sublayer may be dried prior to deposition of the second semiconducting sublayer. The first sublayer and the second sublayer may optionally be annealed together.

These and other non-limiting characteristics of the disclosure are more particularly disclosed below.

BRIEF DESCRIPTION OF THE DRAWINGS

The following is a brief description of the drawings, which are presented for the purposes of illustrating the exemplary embodiments disclosed herein and not for the purposes of limiting the same.

DETAILED DESCRIPTION

Figure 1:
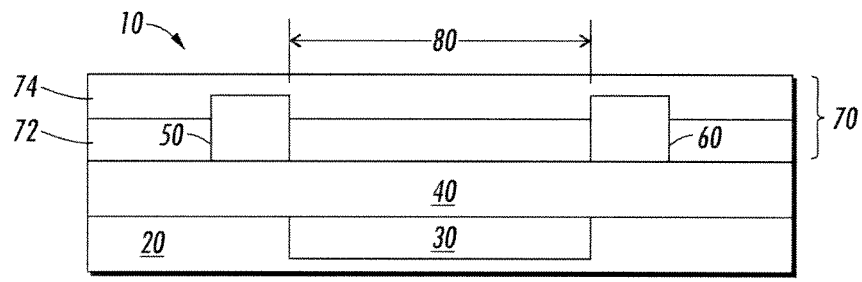
FIG. 1 is a diagram of a first embodiment of a TFT according to the present disclosure.

A more complete understanding of the components, processes and apparatuses disclosed herein can be obtained by reference to the accompanying drawings. These figures are merely schematic representations based on convenience and the ease of demonstrating the present disclosure, and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

The modifier "about" used in connection with a quantity is inclusive of the stated value and has the meaning dictated by the context (for example, it includes at least the degree of error associated with the measurement of the particular quantity). When used in the context of a range, the modifier "about" should also be considered as disclosing the range defined by the absolute values of the two endpoints. For example, the range of "from about 2 to about 10" also discloses the range "from 2 to 10."

The term "comprising" is used herein as requiring the presence of the named component and allowing the presence of other components. The term "comprising" should be construed to include the term "consisting of", which allows the presence of only the named component, along with any impurities that might result from the manufacture of the named component.

The term "room temperature" refers to a temperature in the range of 20° C. to 25° C.

The present disclosure relates to electronic devices comprising a semiconducting bilayer. The semiconducting bilayer includes a first sublayer and a second sublayer. The first sublayer comprises a first semiconductor polythiophene and carbon nanotubes. The second sublayer comprises a second semiconductor and does not contain carbon nanotubes. Processes for producing electronic devices containing the semiconducting bilayers are also disclosed.

FIG. 1 illustrates a bottom-gate bottom-contact TFT configuration according to the present disclosure. The TFT 10 comprises a substrate 20 in contact with the gate electrode 30 and a gate dielectric layer 40. The gate electrode 30 is depicted here in a depression within the substrate 20, but the gate electrode could also be located atop the substrate. It is important that the gate dielectric layer 40 separates the gate electrode 30 from the source electrode 50, drain electrode 60, and the semiconducting bilayer 70. The semiconducting bilayer comprises a first sublayer 72 and a second sublayer 74. The semiconducting bilayer 70 runs over and between the source and drain electrodes 50 and 60. The semiconductor has a channel length 80 between the source and drain electrodes 50 and 60. Both semiconducting sublayers 72 and 74 contact the source and drain electrodes 50 and 60.

Figure 2:
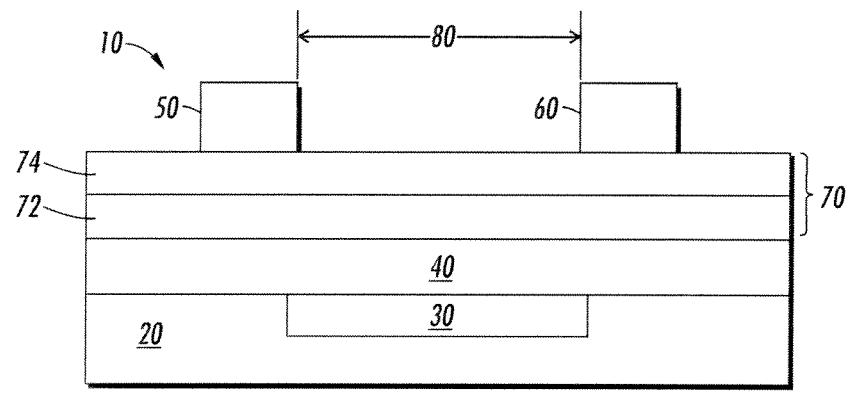
FIG. 2 is a diagram of a second embodiment of a TFT according to the present disclosure.

FIG. 2 illustrates another bottom-gate top-contact TFT configuration according to the present disclosure. The TFT 10 comprises a substrate 20 in contact with the gate electrode 30 and a gate dielectric layer 40. The semiconducting bilayer 70 is placed on top of the gate dielectric layer 40 and separates it from the source and drain electrodes 50 and 60. The semiconducting bilayer 70 includes a first sublayer 72 and a second sublayer 74. Note that only one semiconducting sublayer contacts the source and drain electrodes.

Figure 3:
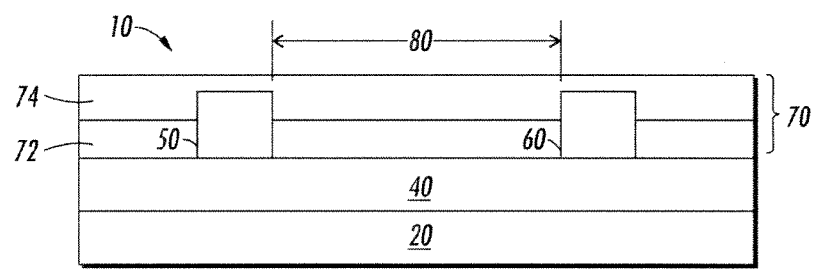
FIG. 3 is a diagram of a third embodiment of a TFT according to the present disclosure.

FIG. 3 illustrates a bottom-gate bottom-contact TFT configuration according to the present disclosure. The TFT 10 comprises a substrate 20 which also acts as the gate electrode and is in contact with a gate dielectric layer 40. The source electrode 50, drain electrode 60, and semiconducting bilayer 70 are located atop the gate dielectric layer 40. The semiconducting bilayer 70 includes a first sublayer 72 and a second sublayer 74. Both semiconducting sublayers 72 and 74 contact the source and drain electrodes 50 and 60.

Figure 4:
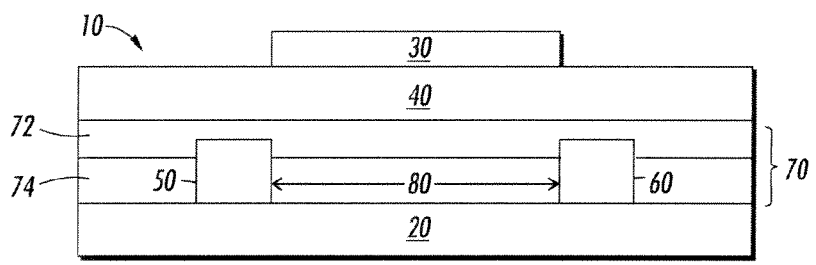
FIG. 4 is a diagram of a fourth embodiment of a TFT according to the present disclosure.

FIG. 4 illustrates a top-gate top-contact TFT configuration according to the present disclosure. The TFT 10 comprises a substrate 20 in contact with the source electrode 50, drain electrode 60, and the semiconducting layer 70. The semiconducting layer 70 runs over and between the source and drain electrodes 50 and 60. The gate dielectric layer 40 is on top of the semiconducting layer 70. The gate electrode 30 is on top of the gate dielectric layer 40 and does not contact the semiconducting layer 70. The semiconducting bilayer 70 comprises a first sublayer 72 and a second sublayer 74. Both semiconducting sublayers 72 and 74 contact the source and drain electrodes 50 and 60.

The first sublayer 72 may also be referred to as the polythiophene stabilized carbon nanotube layer. The second sublayer 74 may also be referred to as the polythiophene layer.

The first sublayer 72 of the present disclosure comprises carbon nanotubes and a first semiconductor. The first semiconductor is a polythiophene which is capable of forming polymer aggregates. The term "polymer aggregates" refers to the ability of the polymer to form discrete particles or clusters of polymer molecules rather than a dissolved individual molecular chain. Such particles have a diameter of from about a few nanometers to about a few micrometers. In embodiments, the semiconducting polymer is a conjugated polymer, the conjugated polymer aggregates having a particle size from about 5 nanometers to about 1 micrometer, including from about 5 nanometers to about 500 nm, as determined using a light scattering method.

In embodiments, the polymer can form stable aggregates at room temperature in the liquid. A variety of processes can be used to form the polymer aggregates, including but not limited to those disclosed in, for example, U.S. Pat. No. 6,890,868 or 6,803,262.

In embodiments, the first semiconductor polythiophene has the structure of Formula (I):

Formula (I)

wherein A is a divalent linkage; each R is independently selected from hydrogen, alkyl, substituted alkyl, alkenyl, substituted alkenyl, alkynyl, substituted alkynyl, aryl, substituted aryl, alkoxy or substituted alkoxy, a heteroatom-containing group, halogen, —CN, or —NO$_2$; and n is from 2 to about 5,000. The polythiophene of Formula (I) is a homopolymer and is capable of forming polymer aggregates.

The term "alkyl" refers to a radical composed entirely of carbon atoms and hydrogen atoms which is fully saturated. The alkyl radical may be linear, branched, or cyclic.

The term "alkylene" refers to a radical composed entirely of carbon atoms and hydrogen atoms, and having the ability to form a single bond with two different non-hydrogen atoms. An alkylene radical has the formula —C$_n$H$_{2n}$—.

The term "alkenyl" refers to a radical composed entirely of carbon atoms and hydrogen atoms which contains at least one carbon-carbon double bond that is not part of an aryl or heteroaryl structure. The alkenyl radical may be linear, branched, or cyclic.

The term "alkynyl" refers to a radical composed entirely of carbon atoms and hydrogen atoms which contains at least one carbon-carbon triple bond.

The term "aryl" refers to an aromatic radical composed entirely of carbon atoms and hydrogen atoms. When aryl is described in connection with a numerical range of carbon atoms, it should not be construed as including substituted aromatic radicals. For example, the phrase "aryl containing from 6 to 10 carbon atoms" should be construed as referring to a phenyl group (6 carbon atoms) or a naphthyl group (10 carbon atoms) only, and should not be construed as including a methylphenyl group (7 carbon atoms). Exemplary aryl groups include phenyl, biphenyl, and fluorenyl.

The term "arylene" refers to an aromatic radical having the ability to form a single bond with two different non-hydrogen atoms. An exemplary arylene is phenylene (—C$_6$H$_4$—).

The term "alkoxy" refers to an alkyl radical which is attached to an oxygen atom, i.e. —O—C$_n$H$_{2n+1}$.

The term "heteroatom-containing group" refers to a cyclic radical containing at least one heteroatom in a ring of the cyclic radical. The cyclic radical may be aromatic or non-aromatic. The heteroatom is generally nitrogen, oxygen, or sulfur.

The term "substituted" refers to at least one hydrogen atom on the named radical being substituted with another functional group, such as halogen, —CN, —NO$_2$, —COOH, or —SO$_3$H. An exemplary substituted alkyl group is a perhaloalkyl group, wherein one or more hydrogen atoms in an alkyl group are replaced with halogen atoms, such as fluorine, chlorine, iodine, and bromine. Besides the aforementioned functional groups, an aryl, arylene, or heteroatom-containing group may also be substituted with alkyl or alkoxy. Exemplary substituted aryl groups include methylphenyl and methoxyphenyl. Exemplary substituted arylene groups include methylphenylene and methoxyphenylene.

Generally, the alkyl, alkylene, alkenyl, alkynyl, and alkoxy groups each independently contain from 1 to 30 carbon atoms, but in particular embodiments may have from 2 to 10 carbon atoms. Similarly, the aryl and arylene groups independently contain from 6 to 30 carbon atoms. In embodiments, n is from about 5 to about 5,000.

The term "divalent linkage" refers to any moiety which is able to form a single bond with two different non-hydrogen atoms, joining those two different atoms together. Exemplary divalent linkages include —O—, —NH—, alkylene, and arylene.

The divalent linkage A forms a single bond to each of the two thienyl moieties in Formula (I). Exemplary divalent linkages A include:

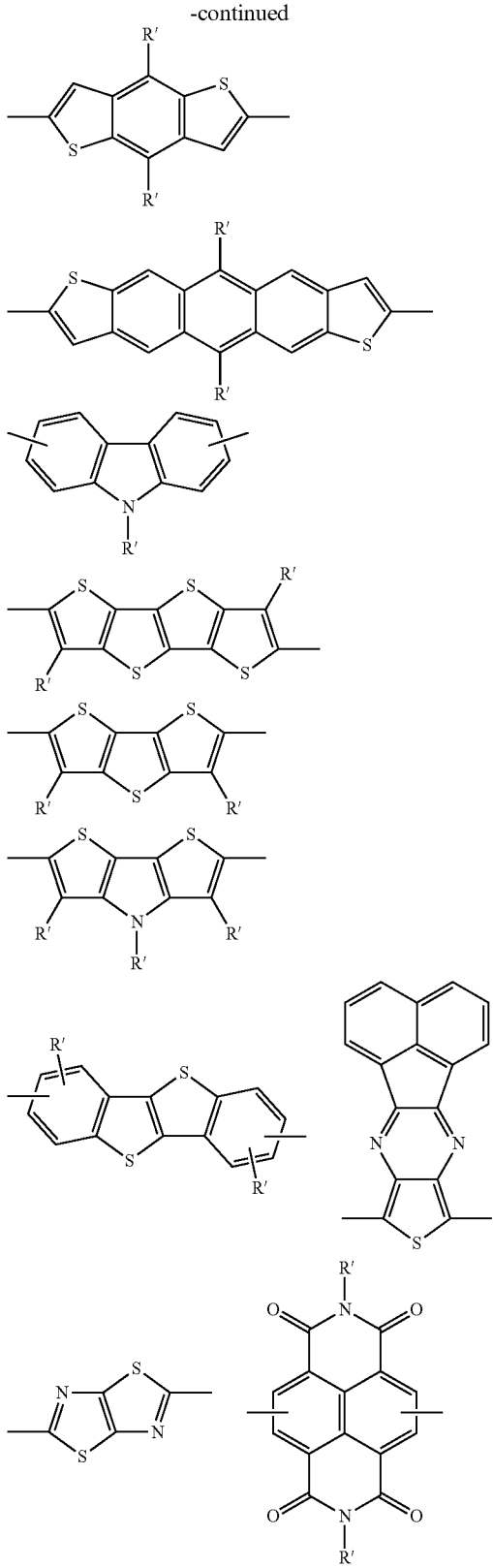

and combinations thereof, wherein each R' is independently selected from hydrogen, alkyl, substituted alkyl, aryl, substituted aryl, alkoxy or substituted alkoxy, a heteroatom-containing group, halogen, —CN, or —NO₂. One or more of these moieties may be present in divalent linkage A. In addition, one or more of a particular moiety may be present in divalent linkage A.

It should be noted that the divalent linkage A will always be different from the two thiophene monomers shown in Formula (I); in other words, Formula (I) will not reduce to being a polythiophene made from only one moiety. In particular embodiments, A is a thienyl moiety which is different from that of the two thiophene moieties shown in Formula (I). For example, R and R' are not the same when A is a thienyl moiety.

In specific embodiments of Formula (I), R is alkyl having from about 6 to about 25 carbon atoms, or R is alkyl having from about 8 to about 16 carbon atoms.

In some embodiments, the first polythiophene has the structure of Formula (II):

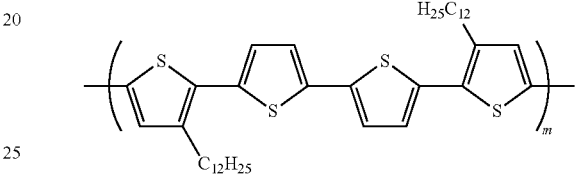

Formula (II)

wherein m is from 2 to about 2,500. The polythiophene may be referred to as PQT-12.

The first sublayer also comprises carbon nanotubes. Carbon nanotubes are an allotrope of carbon. They take the form of cylindrical carbon molecules and have novel properties that make them useful in a wide variety of applications in nanotechnology, electronics, optics, and other fields of materials science. Carbon nanotubes exhibit extraordinary strength, unique electrical properties, and efficient heat conductor properties. The diameter of a nanotube is small, typically on the order of a few nanometers. The length of a nanotube is typically larger, sometimes up to several millimeters. In other words, the carbon nanotubes may have a high aspect ratio, i.e. ratio of length to diameter.

The carbon nanotubes may be single-wall carbon nanotubes, double-wall carbon nanotubes, or multi-wall carbon nanotubes. A single-wall carbon nanotube is a cylinder formed by joining together the edges of a rectangular graphene sheet. A multi-wall carbon nanotube is composed of a number of cylindrical carbon nanotubes having different diameters, which are formed concentrically around each other. The carbon nanotubes can have any suitable length and diameter.

In embodiments, the carbon nanotubes are single-wall carbon nanotubes (SWCNTs). The SWCNTs have a diameter from about 0.5 nanometers to about 2.5 nanometers, including from about 0.7 to about 2.5 nm. In some specific embodiments, the SWCNTs may have a diameter from about 0.7 to 1.2 nm, or from about 0.7 to about 1.0 nm. The SWCNTs may have a length from about 0.1 to about 10 micrometers, including from about 0.5 to about 5 micrometers, from about 0.5 to about 2.5 micrometers, or from about 0.7 to about 1.5 micrometers. The aspect ratio of the SWCNTs may be from about 500 to about 10,000, including from about 500 to 5,000, or from 500 to 1500. These sentences should not be construed as requiring that all nanotubes have the same diameter, length, or aspect ratio. Rather, the nanotubes may have differing diameters, lengths, or aspect ratios within the listed distribution ranges. In specific embodiments, the carbon nanotubes are single-wall semiconducting carbon nanotubes.

In other embodiments, the carbon nanotubes may be surface-modified carbon nanotubes. The surface-modifying group can be attached on the wall or at the ends of the carbon nanotubes. The surfaces of the carbon nanotubes can be modified in two ways: non-covalent attachment and covalent attachment.

In embodiments, the surface-modified carbon nanotubes may be represented by the following formula:

wherein CNT represents the carbon nanotube, $R_1$ is a linking group selected from ester (—COO—) and amide (—CONH—); and $R_2$ is a conjugated group, a non-conjugated group, a small molecular group, an inorganic material, and combinations thereof. The degree of surface modification may vary from about one group per carbon nanotube to about one thousand groups per carbon nanotube.

The surfaces of the carbon nanotubes may be modified with a conjugated group, a non-conjugated group, an inorganic material, and combinations thereof.

Exemplary conjugated groups may include thiophene-based oligomers, pyrenyl, fluorenyl, carbazolyl, triarylamine, and phenyl. The conjugated group can can be covalently bonded directly to the surface of the carbon nanotubes or through a linking group, such as amide or ester.

Exemplary non-conjugated groups may include alkyl, alkoxy, cyano, nitro, urethane, styrene, acrylate, amide, imide, ester, and siloxanes. Also included are non-conjugated groups comprising an acidic moiety, selected from the group consisting of carboxylic acid, sulfonic acid, phosphinic acid, sulfuric acid, nitric acid, phosphoric acid, and the like. In specific embodiments, the surface-modified carbon nanotubes are modified with carboxylic acid, sulfuric acid, and nitric acid. The carbon nanotube-supported acid can dope a semiconductor, particularly p-type semiconductor, to enhance conductivity of the semiconductor layer and thus the field-effect mobility of the transistors.

In specific embodiments, the inorganic material may be conducting or semiconducting. Exemplary inorganic materials include metals and metal oxides such as gold, silver, copper, nickel, zinc, cadmium, palladium, platinum, chromium, aluminum, ZnO, ZnSe, CdSe, $Zn_aIn_bO_c$ (where a, b, and c are integers), GaAs, $ZnO.SnO_2$, $SnO_2$, gallium, germanium, tin, indium, indium oxide, indium tin oxide, and the like. The inorganic material may homogenously cover the surface of the carbon nanotubes or be in nanoparticle form on the surface of the carbon nanotubes. In specific embodiment, the surface-modified carbon nanotubes are modified with nanoparticles selected from the group consisting of gold, silver, nickel, copper, ZnO, CdSe, $Zn_aIn_bO_c$, GaAs, $ZnO.SnO_2$, $SnO_2$, and ZnSe nanoparticles.

Modifying the surface of the carbon nanotubes can enable better miscibility between the carbon nanotubes and the polythiophene of Formula (I). Typically, nanoparticles prefer to form aggregates, due to strong van der Waals force, so that nano-scale dispersion is difficult to achieve. The surface modification increases solubility and allows real nano-scale dispersion of the carbon nanotubes in the polythiophene. When the surface is modified with a conjugated moiety, better charge transfer occurs between the carbon nanotubes and the polythiophene semiconductor.

Carbon nanotubes can be surface modified by suitable methods. For example, a reactive site can be created on the carbon nanotubes, then an oligomer or small molecular compound can be grafted onto the nanotubes at that reactive site. Another approach involves the introduction of carboxylic acid groups onto a carbon nanotube surface via an acid treatment. For example, a mixture of sulfuric acid and nitric acid can be used to form carboxylic acid groups on the surface of a carbon nanotube. Other surface modifying groups can then react with the carboxylic acid group. Other approaches include plasma treatment or direct reaction with highly reactive chemicals such as dichlorocarbene. In other embodiments, the carbon nanotubes are not surface modified.

When dispersed with the first semiconductor polythiophene, the polythiophene can stabilize the carbon nanotubes in a semiconducting composition containing a solvent. This stabilization can occur through several different mechanisms. In embodiments, the property of being capable of forming polymer aggregates helps to disperse and stabilize the carbon nanotubes in the semiconductor composition. As a result, the polymer aggregates help to disperse and stabilize the carbon nanotubes in the solvent. In other embodiments, the dispersed carbon nanotubes function as nuclei, with the first semiconductor polythiophene wrapping around the individual carbon nanotubes to form a nano aggregate of the carbon nanotubes and first semiconductor polythiophene. These nano aggregates may co-exist together with the polymer aggregates. The presence of semiconducting polythiophene wrapped carbon nanotubes and/or semiconducting polythiophene aggregates can be examined using suitable tools such as high resolution transmission electron microscopy or atomic force microscopy techniques.

The first sublayer 72 may comprise from about 10 to about 50 wt % carbon nanotubes, based on the total weight of the first semiconductor polythiophene and the carbon nanotubes. In some embodiments, the carbon nanotubes comprise from about 15 to about 40 wt % of the first sublayer 72.

The weight ratio of carbon nanotubes to polythiophene in the first sublayer 72 may be from about 1:9 to about 1:1. In some embodiments, the weight ratio of carbon nanotubes to polythiophene in the first sublayer is from about 3:17 to about 2:3.

The second sublayer 74 comprises a second semiconductor. Exemplary semiconductors include but are not limited to acenes, such as anthracene, tetracene, pentacene, rubrene, and substituted pentacenes such as TIPS-pentacene; perylenes, fullerenes, oligothiophenes, polythiophenes and their substituted derivatives, polypyrrole, poly-p-phenylenes, poly-p-phenylvinylidenes, naphthalenedicarboxylic dianhydrides, naphthalene-bisimides, polynaphthalenes, phthalocyanines such as copper phthalocyanines, titanyl phthalocyanines, or zinc phthalocyanines and their substituted derivatives, and other fused ring structures such as substituted benzothieno[3,2-b]benzothiophene, triethylsilylethynyl anthradithiophene, and the like.

In particular embodiments, the second semiconductor is a polythiophene. In embodiments, the second semiconductor polythiophene also has the structure of Formula (I) or Formula (II), as described above. The polythiophene in the second sublayer may be the same or a different polythiophene as the polythiophene in the first sublayer 72. The second sublayer 74 is free or substantially free of carbon nanotubes. In some embodiments, the polythiophene of the first sublayer 72 and the second sublayer 74 is PQT-12.

The presence of carbon nanotubes in the first sublayer may improve the mobility of the TFT. The carbon nanotubes are generally more conductive than the polythiophene. It is believed that the carbon nanotubes may form non-percolating arrays inside the channel. The effective channel length may thus be reduced, dramatically improving the mobility. It is also believed that the carbon nanotubes electrically connect adjacent crystal domains of the semiconductor. These connections overcome the grain boundary effect, which typically decreases mobility.

Processes for producing the first sublayer are also disclosed. In particular, it has been found that to achieve both high field-effect mobility and good dispersion of the carbon nanotubes in the polythiophene, a two-step process must be used. This enhances the field-effect mobility by at least 100%, and in some embodiments by a factor of 2 to 3 times. Generally speaking, carbon nanotubes and a first amount of the first semiconductor are dispersed in a liquid to form a first dispersion. A second amount of the first semiconductor is then added to the first dispersion to form a loaded dispersion. The second amount of the first semiconductor is then dissolved or dispersed in the loaded dispersion to form a final dispersion.

Put another way, the carbon nanotubes are dispersed in a first amount of the polythiophene in a solvent to form a first dispersion. The carbon nanotubes are stabilized by the polythiophene. Next, a second amount of the polythiophene is added to the first dispersion to form a loaded dispersion. The second amount of the polythiophene is then dispersed in the loaded dispersion to form a final dispersion. In embodiments, the polythiophene is capable of forming polymer aggregates in the liquid.

An exemplary detailed procedure is now provided. First, the mixture of the first amount of the first semiconducting polymer, the carbon nanotubes, and the liquid is heated to a first elevated temperature. The first amount of the first semiconducting polymer is at least partially dissolved in the liquid at the first elevated temperature. The warm mixture is then lowered to a first lower temperature and probe-sonicated to form the first dispersion. The sonication can be conducted prior to, during, or after lowering the temperature to the first lower temperature. While lowering the temperature, the first semiconducting polymer forms polymer aggregates at the first lower temperature, and the carbon nanotubes are dispersed and stabilized with the first semiconducting polymer and the polymer aggregates. The second amount of the first semiconductor is then added to the first dispersion to form a loaded dispersion. The loaded dispersion is optionally heated to a second elevated temperature, where the second amount of the first semiconductor is at least partially dissolved in the liquid at the second elevated temperature. The loaded dispersion is lowered to a second lower temperature (which is lower than the second elevated temperature) and bath sonicated to form the final dispersion. In some embodiments, the first elevated temperature is the same as the second elevated temperature. In other embodiments, the first elevated temperature is higher than the second elevated temperature by 5 to about 100 degree C., including 10 to about 50 degree C. In some embodiments, the first lower temperature is below room temperature, and the second lower temperature is room temperature. In other embodiments, both the first and the second lower temperatures are below room temperature. After being lowered to the second lower temperature, the composition is brought to room temperature.

In embodiments, the first elevated temperature is from about 40° C. to about 180° C., including from about 60° C. to about 150° C. or from about 60° C. to about 120° C. The second elevated temperature is from about 30° C. to about 150° C., including from about 40° C. to about 120° C. or from about 60° C. to about 100° C. The first lower temperature is from about −25° C. (minus 25° C.) to about 15° C., including from about −10° C. (minus 10° C.) to about 5° C. or around 0 degree C. The second lower temperature is from about −25° C. (minus 25° C.) to about 35° C., including from about −10° C. (minus 10° C.) to about 25° C. or from about 0° C. to about 25° C.

The weight ratio of the carbon nanotubes to the polythiophene in the first dispersion may be from about 1 wt % to about 50 wt %, based on the weight of the polythiophene and the carbon nanotubes. The carbon nanotubes can be dispersed very well in a polythiophene solution and at a very high loading, i.e. close to a 1:1 weight ratio. This first dispersion can be achieved by probe sonication, and results in a very stable dispersion which will not precipitate for weeks. The first dispersion may also be referred to as a stabilized dispersion. Having a highly stabilized dispersion before adding the second amount of the polythiophene is critical. One advantage of this method is that the first dispersion can be used for long-term storage prior to use in forming a semiconducting layer.

The weight ratio of the carbon nanotubes to the polythiophene in the loaded dispersion may be from about 1:99 to about 40:60. The loaded dispersion can be formed by adding a second amount of polythiophene to the first dispersion.

At least two different ways of adding the second amount of polythiophene are contemplated. The second amount of the polythiophene can be added into a solvent and dispersed to form a second dispersion. The loading of the polythiophene in the second dispersion, relative to the weight of the entire second dispersion, should be greater than the loading of the polythiophene in the first dispersion, relative to the weight of the entire first dispersion. Put another way, the second dispersion should have a higher concentration of polythiophene compared to the first dispersion. The first dispersion and the second dispersion are then combined to form the loaded dispersion. The weight ratio of carbon nanotubes to polythiophene is lower in the loaded dispersion than in the first dispersion, due to the addition of the second dispersion.

Alternatively, the second amount of the polythiophene may be added as a powder to the first dispersion. The first dispersion is then heated to dissolve the second amount of the polythiophene into the first dispersion, forming the loaded dispersion.

In embodiments, the first dispersion is formed by using a probe sonication, and the final dispersion is formed by using a bath sonication. The term "probe sonication" refers to sonication wherein a probe is inserted into a container containing the dispersion. The term "bath sonication" refers to sonication wherein the container containing the dispersion is placed into a bath, and the bath is subsequently sonicated. Probe sonication provides much greater energy/power compared to bath sonication. Put another way, for the two-step process, high power or high energy is used during the first dispersing step, while significantly lower energy/power is used during the second dispersing step.

A process for producing an electronic device including the semiconducting bilayer of the present disclosure comprises liquid depositing a first sublayer composition onto a dielectric layer to form a first semiconducting sublayer. The first semiconducting sublayer may be dried, if desired. Next, a second semiconducting composition is liquid deposited on the first semiconducting sublayer to form a second semiconducting sublayer. The first sublayer composition comprises a first polythiophene and carbon nanotubes. The second sublayer composition comprises a second semiconductor. No carbon nanotubes are present in the second sublayer composition. Depending on the desired TFT configuration, the semiconducting bilayer may placed upon the substrate or upon a dielectric layer. Source and drain electrodes may be added on top of the substrate, dielectric layer, or semiconducting bilayer. The source and drain electrodes may be applied before or after the semiconducting bilayer. The first and second sublayers may be annealed together, if desired.

The semiconducting sublayers may be formed in an electronic device using conventional processes known in the art. In embodiments, the sublayers are formed using solution depositing techniques. Exemplary solution depositing techniques include spin coating, blade coating, rod coating, dip coating, screen printing, ink jet printing, stamping, stencil printing, screen printing, gravure printing, flexography printing, and the like. Alternatively, the sublayers may be vapor deposited.

The semiconducting bilayer can be from about 5 nanometers to about 1000 nanometers deep, including from about 20 to about 100 nanometers in depth. In certain configurations, such as the configurations shown in FIGS. 1 and 4, the semiconducting bilayer completely covers the source and drain electrodes.

The first semiconducting sublayer may have a thickness of from about 1 nm to about 30 nm, including from about 2 nm to about 20, or from about 5 nm to about 10 nanometers. In embodiments, the first semiconducting sublayer has a thickness of less than 10 nanometers.

The second semiconducting sublayer may have a thickness of from about 5 nm to about 1000 nm, including from about 5 nm to about 100 nm, or from about 5 nm to about 50 nanometers. In some embodiments, the second semiconducting sublayer has a thickness of from about 30 nm to 50 nanometers.

The performance of a TFT can be measured by mobility. The mobility is measured in units of $cm^2/V \cdot sec$; higher mobility is desired. The resulting TFT using the semiconductor composition of the present disclosure may have a field effect mobility of at least 0.1 $cm^2/V \cdot sec$, including at least 0.2 $cm^2/V \cdot sec$. The TFT of the present disclosure may have a current on/off ratio of at least $10^4$, including at least $10^5$. The TFT of the present disclosure may also have an off current (i.e. leakage current) of less than about $10^{-9}$, or less than $10^{-10}$ amperes.

A thin film transistor generally includes a substrate, an optional gate electrode, source electrode, drain electrode, and a dielectric layer in addition to the semiconducting layer.

The substrate may be composed of materials including but not limited to silicon, glass plate, plastic film or sheet. For structurally flexible devices, plastic substrate, such as for example polyester, polycarbonate, polyimide sheets and the like may be preferred. The thickness of the substrate may be from about 10 micrometers to over 10 millimeters with an exemplary thickness being from about 50 to about 100 micrometers, especially for a flexible plastic substrate and from about 0.5 to about 10 millimeters for a rigid substrate such as glass or silicon.

The dielectric layer generally can be an inorganic material film, an organic polymer film, or an organic-inorganic composite film. Examples of inorganic materials suitable as the dielectric layer include silicon oxide, silicon nitride, aluminum oxide, barium titanate, barium zirconium titanate and the like. Examples of suitable organic polymers include polyesters, polycarbonates, poly(vinyl phenol), polyimides, polystyrene, polymethacrylates, polyacrylates, epoxy resin and the like. The thickness of the dielectric layer depends on the dielectric constant of the material used and can be, for example, from about 10 nanometers to about 500 nanometers. The dielectric layer may have a conductivity that is, for example, less than about $10^{-12}$ Siemens per centimeter (S/cm). The dielectric layer is formed using conventional processes known in the art, including those processes described in forming the gate electrode.

In the present disclosure, the dielectric layer may be surface modified with a surface modifier. The first semiconducting sublayer can be directly contacted with this modified dielectric layer surface. The contact may be complete or partial. This surface modification can also be considered as forming an interfacial layer between the dielectric layer and the semiconducting layer. In particular embodiments, the surface of the dielectric layer has been modified with an organosilane agent of Formula (A):

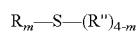  Formula (A)

wherein R is hydrocarbon or fluorocarbon containing from 1 to about 20 carbon atoms, R" is halogen or alkoxy; and m is an integer from 1 to 4. Exemplary organosilanes include octyltrichlorosilane (OTS-8) (R=octyl, R"=chloro, m=1), dodecyltrichlorosilane, phenyltrichlorosilane, methyltrimethoxysilane, phenylmethyldimethoxysilane, phenylmethyldichlorosilane, (3-phenylpropyl)dimethylchlorosilane, (3-phenylpropyl)methyldichlorosilane, phenyltrimethoxysilane, phenethyltrichlorosilane, and the like. In specific embodiments, the R comprises a phenyl group. Other surface modifiers such as polystyrene, polysiloxane, polysilsesquioxane can be used as well.

The gate electrode is composed of an electrically conductive material. It can be a thin metal film, a conducting polymer film, a conducting film made from conducting ink or paste, or the substrate itself, for example heavily doped silicon. Examples of gate electrode materials include but are not restricted to aluminum, gold, silver, chromium, indium tin oxide, conductive polymers such as polystyrene sulfonate-doped poly(3,4-ethylenedioxythiophene) (PSS-PEDOT), and conducting ink/paste comprised of carbon black/graphite. The gate electrode can be prepared by vacuum evaporation, sputtering of metals or conductive metal oxides, conventional lithography and etching, chemical vapor deposition, spin coating, casting or printing, or other deposition processes. The thickness of the gate electrode ranges for example from about 10 to about 200 nanometers for metal films and from about 1 to about 10 micrometers for conductive polymers. Typical materials suitable for use as source and drain electrodes include those of the gate electrode materials such as aluminum, gold, silver, chromium, zinc, indium, conductive metal oxides such as zinc-gallium oxide, indium tin oxide, indium-antimony oxide, conducting polymers and conducting inks. Typical thicknesses of source and drain electrodes are, for example, from about 40 nanometers to about 1 micrometer, including more specific thicknesses of from about 100 to about 400 nanometers.

Typical materials suitable for use as source and drain electrodes include those of the gate electrode materials such as gold, silver, nickel, aluminum, platinum, conducting polymers, and conducting inks. In specific embodiments, the electrode materials provide low contact resistance to the semiconductor. Typical thicknesses are about, for example, from about 40 nanometers to about 1 micrometer with a more specific thickness being about 100 to about 400 nanometers. The OTFT devices of the present disclosure contain a semiconductor channel. The semiconductor channel width may be, for example, from about 5 micrometers to about 5 millimeters with a specific channel width being about 100 micrometers to about 1 millimeter. The semiconductor channel length may be, for example, from about 1 micrometer to about 1 millimeter with a more specific channel length being from about 5 micrometers to about 100 micrometers.

The source electrode is grounded and a bias voltage of, for example, about 0 volt to about 80 volts is applied to the drain electrode to collect the charge carriers transported across the semiconductor channel when a voltage of, for example, about +10 volts to about −80 volts is applied to the gate electrode. The electrodes may be formed or deposited using conventional processes known in the art.

If desired, a barrier layer may also be deposited on top of the TFT to protect it from environmental conditions, such as light, oxygen and moisture, etc. which can degrade its electrical properties. Such barrier layers are known in the art and may simply consist of polymers.

The various components of the OTFT may be deposited upon the substrate in any order. Generally, however, the gate electrode and the semiconducting layer should both be in contact with the gate dielectric layer. In addition, the source and drain electrodes should both be in contact with the semiconducting layer. The phrase "in any order" includes sequential and simultaneous formation. For example, the source electrode and the drain electrode can be formed simultaneously or sequentially. The term "on" or "upon" the substrate refers to the various layers and components with reference to the substrate as being the bottom or support for the layers and components which are on top of it. In other words, all of the components are on the substrate, even though they do not all directly contact the substrate. For example, both the dielectric layer and the semiconducting layer are on the substrate, even though one layer is closer to the substrate than the other layer. The resulting TFT has good mobility and good current on/off ratio.

The following examples are for purposes of further illustrating the present disclosure. The examples are merely illustrative and are not intended to limit devices made in accordance with the disclosure to the materials, conditions, or process parameters set forth therein. All parts are percentages by volume unless otherwise indicated.

EXAMPLES

Example 1

Single-wall carbon nanotubes (CNT) were added to 1,2-dichlorobenzene up to a concentration of 0.05 wt %. The mixture was probe ultra-sonicated at 50% power for 20 seconds. PQT-12 powder was added to the CNT dispersion until a concentration of 0.1 wt % PQT-12 was attained. The weight ratio of CNT to PQT-12 was 1:2. The mixture was warmed to dissolve the PQT-12 and then probe ultra-sonicated for 20 seconds. The resultant dispersion of CNT in PQT nanoparticles was very stable. The dispersion was centrifuged at 3,500 rpm for 30 minutes to remove any agglomerates.

Example 2

TFTs were fabricated on silicon wafer substrate using the PQT-12/CNT composition of Example 1 to form the first semiconducting sub-layer. N-doped silicon functioned as the gate and a 200 nm silicon oxide layer functioned as the gate dielectric. The silicon oxide was modified with octyltrichlorosilane. The PQT-12/CNT composition was spin coated on the wafer at 1,000-2,500 rpm to form the first sublayer (around 5 nm thick). The first sublayer was dried in a vacuum oven at 70-80° C. for 30-60 minutes. Next, a 0.3 wt % PQT-12 dispersion was spin coated at 1,000 rpm for 120 seconds upon the first sublayer to form a second sublayer (around 30 nm thick). The second sublayer was dried at 80° C. and annealed at 140° C. in a vacuum. Gold source and drain electrodes were evaporated upon the semiconducting bilayer through a shadow mask.

Comparative Example 1

TFTs were fabricated using the same materials and basic procedure of Example 2. However, instead of a semiconducting bilayer, the single semiconducting layer contained only PQT-12, and having a thickness around 30 nm.

Comparative Example 2

In Comparative Example 2, the PQT-12/CNT composition produced in Example 1 was mixed with a PQT-12 dispersion to form a mixture. Then, the mixture was coated onto a silicon wafer substrate and dried to form a single semiconducting layer that contained 10 wt % of carbon nanotubes and 90 wt % of PQT-12. The thickness of the single layer was around 40 nm. Gold source and drain electrodes were evaporated on top of the semiconducting layer through a shadow mask.

Results

The results of these experiments are summarized in Table 1:

|  | Mobility (cm$^2$/V-s) | Current On/Off Ratio |
| --- | --- | --- |
| Example 2 | 0.4-0.53 | 10$^5$ |
| Comparative Example 1 | ~0.1 | — |
| Comparative Example 2 | 0.2-0.3 | — |

The TFTs of Example 2 exhibited field effect mobilities of from about 0.4 to about 0.53 cm$^2$/V·sec and high current on/off ratio of about 10$^5$. Devices fabricated in Comparative Example 1, i.e. devices including a single semiconducting layer of pure polythiophene, only achieved mobilities of about 0.1 cm$^2$/V·sec. Devices fabricated in accordance with Comparative Example 2 only showed mobilities in the range of 0.2 to 0.3 cm$^2$/V·sec. Devices comprising the semiconducting bilayer of the present disclosure exhibited superior results.

It will be appreciated that variants of the above-disclosed and other features and functions, or alternatives thereof, may be combined into many other different systems or applications. Various presently unforeseen or unanticipated alternatives, modifications, variations or improvements therein may be subsequently made by those skilled in the art which are also intended to be encompassed by the following claims.

The invention claimed is:

1. An electronic device including a semiconducting bilayer, the semiconducting bilayer comprising:
    a first sublayer including a first semiconductor and carbon nanotubes, the first semiconductor being a polythiophene; and
    a second sublayer including a second semiconductor and not containing carbon nanotubes,
    wherein the carbon nanotubes include from about 15 to about 40 wt % of the first sublayer, based on a total weight of the first semiconductor and the carbon nanotubes.

2. The electronic device of claim 1, wherein the second semiconductor is a polythiophene.

3. The electronic device of claim 2, wherein the first semiconductor polythiophene and the second semiconductor polythiophene each have the structure of Formula (II):

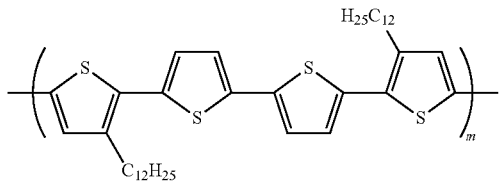

Formula (II)

wherein m is from 2 to about 2,500.

4. The electronic device of claim 1, wherein the first semiconductor polythiophene and the second semiconductor independently have a structure of Formula (I):

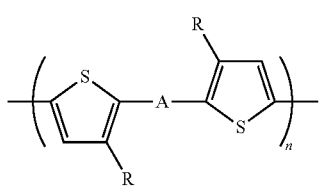

Formula (I)

wherein A is a divalent linkage; each R is independently selected from hydrogen, alkyl, substituted alkyl, alkenyl, substituted alkenyl, alkynyl, substituted alkynyl, aryl, substituted aryl, alkoxy, substituted alkoxy, a heteroatom-containing group, halogen, —CN, or —NO$_2$; and n is from 2 to about 5,000.

5. The electronic device of claim 4, wherein R is alkyl having from about 6 to about 25 carbon atoms.

6. The electronic device of claim 1, wherein the first sublayer comprises polymer aggregates of the first semiconductor separating the carbon nanotubes.

7. The electronic device of claim 1, wherein the first sublayer comprises nano aggregates formed by the first semiconducting polymer wrapping around a carbon nanotube.

8. The electronic device of claim 1, wherein the first sublayer has a thickness of less than 10 nanometers.

9. The electronic device of claim 1, wherein the carbon nanotubes are surface-modified carbon nanotubes.

10. The electronic device of claim 1, wherein the carbon nanotubes are single-wall carbon nanotubes.

11. The electronic device of claim 1, further comprising a dielectric layer; wherein the first sublayer contacts the dielectric layer.

12. A process for producing a semiconductor layer of an electronic device, the process comprising:
liquid depositing a first semiconducting composition onto a dielectric layer to form a first semiconducting sublayer;
optionally drying the first sublayer; and
liquid depositing a second semiconducting composition onto the first semiconducting sublayer to form a second semiconducting sublayer;
wherein the first semiconducting sublayer includes a first polythiophene and carbon nanotube,
wherein the carbon nanotubes include from about 15 to about 40 wt % of the first semiconducting sublayer, based on a total weight of the first polythiophene and the carbon nanotubes,
wherein the second semiconducting sublayer includes a second polythiophene and does not contain carbon nanotubes; and
optionally annealing the first sublayer and the second sublayer together to form the semiconductor layer.

13. The process of claim 12, wherein the first polythiophene has the structure of Formula (II):

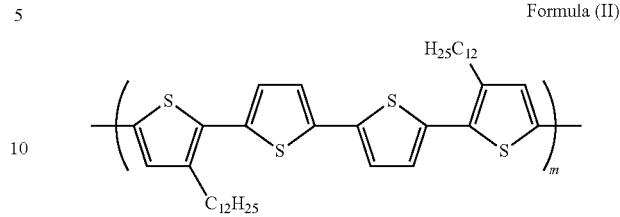

Formula (II)

wherein m is from 2 to about 2,500.

14. A thin-film transistor, comprising:
a dielectric layer and a semiconducting bilayer,
wherein the semiconducting bilayer includes,
a first sublayer including a first semiconductor polythiophene and carbon nanotubes, and
a second sublayer including a second semiconductor and not containing carbon nanotubes,
wherein the first sublayer is between the dielectric layer and the second sublayer,
wherein the first polythiophene has the structure of Formula (I):

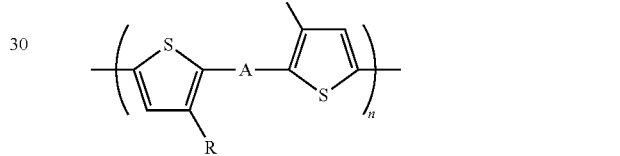

Formula (I)

wherein A is a divalent linkage; each R is independently selected from hydrogen, alkyl, substituted alkyl, alkenyl, substituted alkenyl, alkynyl, substituted alkynyl, aryl, substituted aryl, alkoxy, substituted alkoxy, a heteroatom-containing group, halogen, —CN, or —NO$_2$; and n is from 2 to about 5,000, and
wherein the carbon nanotubes include from about 15 to about 40 wt % of the first sublayer, based on a total weight of the first semiconductor polythiophene and the carbon nanotubes.

15. The thin-film transistor of claim 14, wherein the second semiconductor is the same as the first semiconductor polythiophene.

16. The thin-film transistor of claim 14, wherein the first semiconductor polythiophene and the second semiconductor independently have the structure of Formula (II):

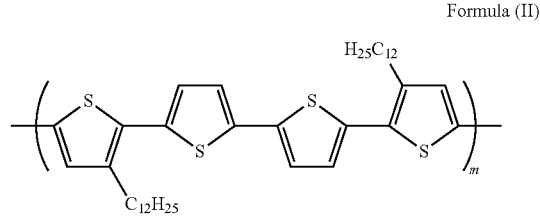

Formula (II)

wherein m is from 2 to about 2,500.

17. The thin-film transistor of claim 14, wherein the carbon nanotubes are single-wall carbon nanotubes, and the first sublayer has a thickness of less than 10 nm.

* * * * *